(12) United States Patent
Lutsen et al.

(10) Patent No.: US 8,173,267 B2
(45) Date of Patent: *May 8, 2012

(54) FUNCTIONALIZATION OF POLY(ARYLENEVINYLENE) POLYMERS FOR INTEGRATED CIRCUITS

(75) Inventors: Laurence Lutsen, Coudekerque-Branche (FR); Dirk Vandezande, Hasselt (BE); Fateme Banishoeib, Taranto (IT)

(73) Assignees: IMEC, Leuven (BE); Universiteit Hasselt, Diepenbeek (BE)

( * ) Notice: Subject to any disclaimer, the term of this patent is extended or adjusted under 35 U.S.C. 154(b) by 1129 days.

This patent is subject to a terminal disclaimer.

(21) Appl. No.: 12/026,385

(22) Filed: Feb. 5, 2008

(65) Prior Publication Data
US 2009/0035597 A1    Feb. 5, 2009

Related U.S. Application Data

(60) Provisional application No. 60/957,373, filed on Aug. 22, 2007.

(30) Foreign Application Priority Data

Aug. 1, 2007  (EP) ................... 07447045

(51) Int. Cl.
*B32B 27/28*   (2006.01)
*C08F 8/34*   (2006.01)

(52) U.S. Cl. ....... 428/500; 525/55; 525/328.5; 525/343; 525/350; 525/384; 525/386

(58) Field of Classification Search ............... 428/500
See application file for complete search history.

(56) References Cited

U.S. PATENT DOCUMENTS

| | | | |
|---|---|---|---|
| 5,526,031 A * | 6/1996 | Kurabayashi | 347/105 |
| 4,840,526 A | 10/1998 | Hsieh | |
| 6,638,685 B2 | 10/2003 | Maeda et al. | |
| 6,660,479 B2 | 12/2003 | Kim et al. | |
| 6,689,530 B2 | 2/2004 | Ohsawa et al. | |

FOREIGN PATENT DOCUMENTS

| | | |
|---|---|---|
| EP | 4840530 A2 | 5/2005 |
| EP | 4840541 A2 | 6/2005 |

* cited by examiner

*Primary Examiner* — John J Figueroa
(74) *Attorney, Agent, or Firm* — Knobbe Martens Olson & Bear LLP

(57) ABSTRACT

A method is provided for modifying a poly(arylene vinylene) or poly(heteroarylene vinylene) precursor polymer having dithiocarbamate moieties by reacting it with an acid and further optionally reacting the acid-modified polymer with a nucleophilic agent. Also provided are novel polymers and copolymers bearing nucleophilic side groups which are useful as components of electronic devices, e.g. in the form of thin layers.

19 Claims, No Drawings

FUNCTIONALIZATION OF POLY(ARYLENEVINYLENE) POLYMERS FOR INTEGRATED CIRCUITS

CROSS-REFERENCE TO RELATED APPLICATIONS

This application claims the benefit under 35 U.S.C. §119 (e) of U.S. provisional application Ser. No. 60/957,373, filed Aug. 22, 2007, and claims the benefit under 35 U.S.C. §119 (a)-(d) of European application No. 07447045.1, filed Aug. 1, 2007, the disclosures of which are hereby expressly incorporated by reference in their entirety and are hereby expressly made a portion of this application.

FIELD OF THE INVENTION

A method is provided for the modification and optionally the further functionalization of poly(arylenevinylene) and poly(heteroarylene-vinylene) precursor polymers by means of an acid. A class of novel polymers and copolymers obtainable by this method is also provided, as are electronic devices comprising layers of such novel polymers and copolymers.

BACKGROUND OF THE INVENTION

Conjugated polymers are of great interest for the development of optical and electronic applications because of their extended π-electron delocalization along the backbone. A problem however frequently occurring during the synthesis of conjugated polymers is their insolubility due to their rigid backbone. Quite often the solubility problem is circumvented by the use of a soluble and easily processable non-conjugated precursor polymer. Nowadays, such precursor polymers can be synthesized via several different routes (e.g. dehalogenation or Gilch route, sulfonium or Wessling-Zimmerman precursor route, xanthate precursor route and sulfinyl precursor route) having in common that they make use of polymerization behavior of p-quinodimethane systems. These routes differ however in the choice of the leaving group and polarizer group in the pre-monomer structure and in the polymerization conditions (base and solvents, reaction temperatures and reaction time) used. Initially, these methods were developed for the synthesis of poly (1,4-phenylene vinylene) (hereinafter referred as PPV) derivatives and were later adapted for the synthesis of other poly (heteroarylene vinylene) derivatives, but with mixed success. Especially the synthesis of electron rich conjugated polymers such as poly (2,5-thienylene vinylene) (hereinafter referred as PTV) via these precursor routes is problematic. In particular, the high reactivity of intermediates or even the monomer itself precludes the development of a reproducible, versatile, low polydispersity and high yield polymerization process towards PTV derivatives, due to the electron rich nature of the thiophene ring.

Accordingly there is still a strong need in the art for improving the conversion of a poly(arylene vinylene) precursor polymer into a conjugated poly (arylene-vinylene) such as PPV or PTV. There is also a need in the art for providing alternative derivatives of conjugated poly (arylene-vinylene), e.g. through the functionalization of such precursor polymers, which may exhibit unexpectedly unique physical, chemical and/or electrical properties. There is also a need in the art for providing alternative layer components for electronic or optical devices such as, but not limited to, solar cells, light-emitting diodes, chemical sensors, biological sensors and integrated circuits.

SUMMARY OF THE INVENTION

The methods, compositions, and devices of preferred embodiments provide a cost-effective and environmentally-friendly solution to one or more of the above outlined problems, especially by designing a poly(arylene vinylene) precursor polymer modification method being free from the prior art drawbacks and limitations.

According to a first aspect, a method is provided for the acid-induced modification of dithiocarbamate-containing precursor polymers. According to a preferred embodiment, the method is particularly suitable for the improved conversion of dithiocarbamate-containing precursor polymers into poly (arylene vinylene) or poly (heteroarylene vinylene) polymers or copolymers. It has been surprisingly found that this embodiment is specific to dithiocarbamate-containing precursor polymers and is not applicable to xanthate-containing precursor polymers. According to another embodiment, the method further includes the reaction of said poly (arylene vinylene) or poly (heteroarylene vinylene) polymers or copolymers with a nucleophile. This embodiment is particularly suitable for the functionalization of polymers without subjecting them to polymerization conditions, also called post polymer functionalization.

According to a second aspect, a broad class of novel polymers and copolymers is provided obtainable by the above methods and which comprise at least a monomeric moiety including a nucleophile as a side chain or side group.

According to a third aspect, a device is provided comprising layers, preferably thin layers, of a novel polymer or copolymer according to the second aspect. According to a preferred embodiment, this device can be, but is not limited to, a solar cell, a light-emitting diode, a chemical sensor, a biological sensor or an integrated circuit component.

DETAILED DESCRIPTION OF THE PREFERRED EMBODIMENT

Definitions

As used herein with respect to a substituting group, and unless otherwise stated, the term "$C_{1-4}$ alkyl" refers to a straight (non-branched) or branched chain saturated acyclic hydrocarbon monovalent group having from 1 to 4 carbon atoms such as, for example, methyl, ethyl, propyl, n-butyl, 1-methylethyl (isopropyl), 2-methylpropyl (isobutyl), and 1,1-dimethylethyl (tert-butyl). Similarly, the term "$C_{1-20}$ alkyl" refers to straight (non-branched) or branched chain groups having from 1 to 20 carbon atoms such as, for example, pentyl, hexyl, heptyl, octyl, nonyl, decyl, dodecyl, tetradecyl, hexadecyl, octadecyl and the like.

As used herein with respect to a substituting group, and unless otherwise stated, the term "aryl" designates any mono- or polycyclic aromatic monovalent hydrocarbon group having from 6 to 30 carbon atoms such as, but not limited to, phenyl, naphthyl, anthracenyl, phenanthracyl, fluoranthenyl, chrysenyl, pyrenyl, biphenylyl, terphenyl, picenyl, indenyl, biphenyl, indacenyl, tetrahydropyrenyl, benzocyclobutenyl, benzocyclooctenyl and the like, including fused benzo-$C_{4-8}$ cycloalkyl groups such as, for instance, indanyl, tetrahydronaphthyl, fluorenyl and the like, all of the said groups being optionally substituted with one or more substituents (preferably 1 to 3 substituents) independently selected from the group consisting of halogen, $C_{1-4}$ alkyl, nitro, trifluoromethoxy, halo $C_{1-7}$ alkyl and $C_{1-4}$ alkoxy (all of such substituents being such as herein defined, including individual species and sub-groups thereof), such as for instance 4-fluorophenyl, 4-chlorophenyl, 3,4-dichlorophenyl, 2,6-dichlorophenyl, 2-fluorophenyl, 3-chlorophenyl, 3,5-dichloro-phenyl, trifluoromethylphenyl and 3,4-dimethoxyphenyl, iodophenyl, bromo-phenyl.

As used herein with respect to a substituting group, and unless otherwise stated, the term "heterocyclic" means a mono- or polycyclic, saturated or mono-unsaturated or poly-unsaturated monovalent hydrocarbon group having from 2 to 15 carbon atoms and including one or more heteroatoms in one or more heterocyclic rings, each of said rings having from 3 to 10 atoms (and optionally further including one or more heteroatoms attached to one or more carbon atoms of said ring, for instance in the form of a carbonyl, and/or to one or more heteroatoms of said ring, for instance in the form of a sulfone, sulfoxide or N-oxide), each of said heteroatoms being independently selected from the group consisting of nitrogen, oxygen and sulfur, also including groups wherein a heterocyclic ring is fused to one or more aromatic hydrocarbon rings for instance in the form of benzo-fused, dibenzo-fused and naphtho-fused heterocyclic groups; within this definition are included heterocyclic groups such as, but not limited to, diazepinyl, oxadiazinyl, thiadiazinyl, dithiazinyl, triazolonyl, diazepinonyl, triazepinyl, triazepinonyl, tetrazepinonyl, benzoquinolinyl, benzo-thiazinyl, benzothiazinonyl, benzoxathiinyl, benzodioxinyl, benzodithiinyl, benzoxaze-pinyl, benzothiazepinyl, benzodiazepinyl, benzodioxepinyl, benzo-dithiepinyl, benzoxazocinyl, benzothiazocinyl, benzodiazocinyl, benzoxathiocinyl, benzodioxocinyl, benzotrioxepinyl, benzoxathiazepinyl, benzoxadiazepinyl, benzothiadiazepinyl, benzotriazepinyl, benzoxathiepinyl, benzotriazinonyl, benzoxazolinonyl, azetidinonyl, azaspiroundecyl, dithiaspirodecyl, selenazinyl, selenazolyl, selenophenyl, hypoxanthinyl, azahypoxanthinyl, bipyrazinyl, bipyridinyl, oxazolidinyl, diselenopyrimidinyl, benzodioxocinyl, benzopyrenyl, benzopyranonyl, benzophenazinyl, benzoquinolizinyl, dibenzocarbazolyl, dibenzoacridinyl, dibenzo-phenazinyl, dibenzothiepinyl, dibenz-oxepinyl, dibenzopyranonyl, dibenzoquino-xalinyl, dibenzothiazepinyl, dibenzisoquinolinyl, tetraazaadamantyl, thiatetra-azaadamantyl, oxauracil, oxazinyl, dibenzothiophenyl, dibenzofuranyl, oxazolinyl, oxazolonyl, azaindolyl, azolonyl, thiazolinyl, thiazolonyl, thiazolidinyl, thiazanyl, pyrimidonyl, thiopyrimidonyl, thiamorpholinyl, azlactonyl, naphtindazolyl, naphtindolyl, naphtothiazolyl, naphtothioxolyl, naphtoxindolyl, naphtotriazolyl, naphtopyranyl, oxabicycloheptyl, azabenzimidazolyl, azacycloheptyl, azacyclooctyl, azacyclononyl, azabicyclononyl, tetrahydrofuryl, tetrahydropyranyl, tetrahydropyronyl, tetrahydroquinoleinyl, tetrahydrothienyl and dioxide thereof, dihydrothienyl dioxide, dioxindolyl, dioxinyl, dioxenyl, dioxazinyl, thioxanyl, thioxolyl, thiourazolyl, thiotriazolyl, thiopyranyl, thiopyronyl, coumarinyl, quinoleinyl, oxyquinoleinyl, quinuclidinyl, xanthinyl, dihydropyranyl, benzodihydrofuryl, benzothiopyronyl, benzothiopyranyl, benzoxazinyl, benzoxazolyl, benzodioxolyl, benzodioxanyl, benzothiadiazolyl, benzotriazinyl, benzothiazolyl, benzoxazolyl, phenothioxinyl, phenothiazolyl, phenothienyl (benzothiofuranyl), phenopyronyl, phenoxazolyl, pyridinyl, dihydropyridinyl, tetrahydropyridinyl, piperidinyl, morpholinyl, thiomorpholinyl, pyrazinyl, pyrimidinyl, pyridazinyl, triazinyl, tetrazinyl, triazolyl, benzotriazolyl, tetrazolyl, imidazolyl, pyrazolyl, thiazolyl, thiadiazolyl, isothiazolyl, oxazolyl, oxadiazolyl, pyrrolyl, furyl, dihydrofuryl, furoyl, hydantoinyl, dioxolanyl, dioxolyl, dithianyl, dithienyl, dithiinyl, thienyl, indolyl, indazolyl, benzofuryl, quinolyl, quinazolinyl, quinoxalinyl, carbazolyl, phenoxazinyl, phenothiazinyl, xanthenyl, purinyl, benzothienyl, naphtothienyl, thianthrenyl, pyranyl, pyronyl, benzopyronyl, isobenzofuranyl, chromenyl, phenoxathiinyl, indolizinyl, quinolizinyl, isoquinolyl, phthalazinyl, naphthiridinyl, cinnolinyl, pteridinyl, carbolinyl, acridinyl, perimidinyl, phenanthrolinyl, phenazinyl, phenothiazinyl, imidazolinyl, imidazolidinyl, benzimidazolyl, pyrazolinyl, pyrazolidinyl, pyrrolinyl, pyrrolidinyl, piperazinyl, uridinyl, thymidinyl, cytidinyl, aziridinyl, aziridinyl, diazirinyl, diaziridinyl, oxiranyl, oxaziridinyl, dioxiranyl, thiiranyl, azetyl, dihydroazetyl, azetidinyl, oxetyl, oxetanyl, oxetanonyl, homopiperazinyl, homopiperidinyl, thietyl, thietanyl, diazabicyclooctyl, diazetyl, diaziridinonyl, diaziridinethionyl, chromanyl, chromanonyl, thiochromanyl, thiochromanonyl, thiochromenyl, benzofuranyl, benzisothiazolyl, benzocarbazolyl, benzochromonyl, benzisoalloxazinyl, benzocoumarinyl, thiocoumarinyl, phenometoxazinyl, phenoparoxazinyl, phentriazinyl, thiodiazinyl, thiodiazolyl, indoxyl, thioindoxyl, benzodiazinyl (e.g. phtalazinyl), phtalidyl, phtalimidinyl, phtalazonyl, alloxazinyl, dibenzopyronyl (i.e. xanthonyl), xanthionyl, isatyl, isopyrazolyl, isopyrazolonyl, urazolyl, urazinyl, uretinyl, uretidinyl, succinyl, succinimido, benzylsultimyl, benzylsultamyl, thieno-thiophenyl, pyrrolo-pyrrolyl, dibenzothiophenyl, and the like, wherein each carbon atom of said heterocyclic ring may furthermore be independently substituted; depending upon the number of unsaturations in the 3 to 10 atoms ring, heterocyclic groups may be sub-divided into heteroaromatic (or "heteroaryl") groups and non-aromatic heterocyclic groups according to standard knowledge in the art; when a heteroatom of said heterocyclic group is nitrogen, the latter may be substituted with a substituent selected from the group consisting of $C_{1-4}$ alkyl, aryl or aryl-$C_{1-4}$ alkyl (all of them being such as herein defined, including sub-groups thereof).

As used herein with respect to a substituting atom, and unless otherwise stated, the term halogen means any atom selected from the group consisting of fluorine, chlorine, bromine and iodine.

As used herein with respect to a substituting group, and unless otherwise stated, the term "halo $C_{1-4}$ alkyl" means a $C_{1-4}$ alkyl group (such as above defined, including sub-groups thereof) in which one or more hydrogen atoms are independently replaced by a corresponding number of independently selected halogen atoms (preferably fluorine, chlorine or bromine) such as, but not limited to, fluoromethyl, difluoromethyl, trifluoromethyl, chloromethyl, chlorodifluoromethyl, dichlorofluoromethyl and the like.

As used herein with respect to a substituting group, and unless otherwise stated, the term "$C_{1-20}$ alkoxy" refers to substituents wherein a carbon atom of a $C_{1-20}$ alkyl group (such as defined herein above, including sub-groups thereof), is attached to an oxygen atom through a single bond such as, but not limited to methoxy, ethoxy, propoxy, n-butoxy, isopropoxy, sec-butoxy, tert-butoxy, pentyloxy, undecyloxy and the like.

As used herein with respect to a substituting group, and unless otherwise stated, the term "arylalkyl" refers to an aliphatic saturated hydrocarbon monovalent group (preferably a $C_{1-20}$ alkyl group such as defined above, including sub-groups thereof) onto which an aryl group (such as defined above, including sub-groups thereof) is bonded such as, but not limited to, benzyl, 4-chlorobenzyl, 4-fluorobenzyl, 2-fluorobenzyl, 3,4-dichlorobenzyl, 2,6-dichlorobenzyl, and phenylethyl.

As used herein with respect to a substituting group, and unless otherwise stated, the term "$C_{3-20}$ cycloalkyl" means a monocyclic saturated hydrocarbon monovalent group having from 3 to 20 carbon atoms, such as for instance cyclopropyl, cyclobutyl, cyclopentyl, cyclohexyl, cycloheptyl, cyclooctyl and the like.

As used herein with respect to a substituting group, and unless otherwise stated, the term "$C_{1-20}$ alkysulfate" refers to substituents wherein a carbon atom of a $C_{1-20}$ alkyl group (such as defined herein above, including sub-groups thereof), is attached to an oxygen atom of a sulfate group through a single bond such as, but not limited to methylsulfate (methoxysulfonyloxy), ethylsulfate (ethoxysulfonyloxy), n-butylsulfate (n-butoxysulfonyloxy), tert-butylsulfate (tert-butoxysulfonyloxy), undecylsulfate (undecyloxysulfonyloxy), and the like.

As used herein with respect to a linking group, and unless otherwise stated, the term "arylene" designates any divalent group derived from aryl (such as above defined) by abstracting a hydrogen atom.

As used herein with respect to a linking group, and unless otherwise stated, the term "heteroarylene" designates any divalent group derived from heteroaryl (such as above defined) by abstracting a hydrogen atom.

As used herein with respect to a reactant in a functionalization method, and unless otherwise stated, the term "nucleophile" designates any species (neutral "neutral nucleophiles" or negatively charged) that are attracted to positive sources. Typical nucleophiles are any negative or neutral atom that has a lone pair to donate. Nucleophiles can also be called Lewis base because they can donate electrons during a chemical reaction (nucleophillic substitution).

As used herein with respect to a substituting group, and unless otherwise stated, the term "amino-acid" refers to a group derived from a molecule having the chemical formula $H_2N$—CHR—COOH, wherein R is the side group of atoms characterizing the amino-acid type; said molecule may be one of the 20 naturally-occurring amino-acids or any similar non naturally-occurring amino-acid.

As used herein with respect to a substituting group, and unless otherwise stated, the term "alkaloid" refers to a nitrogenous organic molecule having a pharmacological effect on a human being or another mammal.

According to a first aspect, a method is provided for modifying a polymer having dithiocarbamate moieties and being represented by the structural formula (I),

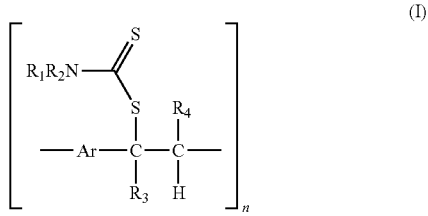

wherein:
Ar is arylene or heteroarylene optionally substituted with one or more substituents independently selected from the group consisting of $C_{1-20}$ alkyl, $C_{1-20}$ alkoxy, $C_{1-20}$ alkylsulfate, aryl and aryl-$C_{1-4}$ alkyl,
$R_1$ and $R_2$ are independently selected from the group consisting of $C_{1-20}$ alkyl, $C_{3-20}$ cycloalkyl, aryl, aryl-$C_{1-4}$ alkyl and heterocyclyl,
$R_3$ and $R_4$ are independently selected from the group consisting of hydrogen, $C_{1-20}$ alkyl, $C_{3-20}$ cycloalkyl, aryl, aryl-$C_{1-4}$alkyl, and heterocyclyl, and n is such that the number average molecular weight of the polymer is in the range from 5,000 to 1,000,000 Dalton, wherein said method comprises a step of reacting said polymer with an acid. The modification can be functionalization of the polymer such as forming a conjugated polymer or by substituting at least a part of the dithiocarbamate moieties to thereby introduce another functionality. The modification optionally involves protonation of at least a part of the dithiocarbamate moieties.

In a preferred embodiment, the arylene or heteroarylene divalent group Ar may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,5-furanediyl; 2,5-pyrrolediyl; 1,3,4-oxadiazole-2,5-dyil; 1,3,4-thiadiazole-2,5-diyl; 2,3-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-bi-phenylene; phenantrene-2,7-diyl; 9,10-dihydrophenantrene-2,7-diyl; dibenzofurane-2,7-diyl; and dibenzothiophene-2,7-diyl. Preferably Ar is 1,4-phenylene or 2,5-thienylene.

Precursor polymers of poly (arylene vinylene) and poly (heteroarylene vinylene), more particularly PTV or PPV precursors that are suitable for modification according to the method of the preferred embodiments can be prepared by any method known in the art such as, for example, by means of competitive nucleophilic substitution of the Wessling polyelectrolyte "Wessling route" with sodium diethyl dithiocarbamate or by means of polymerization of starting monomers bearing dithiocarbamate groups "dithiocarbamate route", stable in time, leading in high yields to precursor polymers with high molecular weight and/or high $\lambda_{max}$ values.

The modification process according to the preferred embodiments can suitably be effected in solution in one or more organic solvents. The selection of an appropriate solvent is within the ordinary skill of the skilled person and depends namely upon the solubility of the precursor polymer and the solubility of the acid used for polymer modification. Effective solvents have been found to include "non-polar solvents", "polar aprotic solvents", and "polar protic solvents" such as, but not limited to, aliphatic hydrocarbons, heterocyclic hydrocarbons, ethers, halogenated aliphatic hydrocarbons, aliphatic carboxylic acid esters (e.g. alkyl acetates), ketones, nitriles, formamides, dimethyl sulfoxide, alkanoic acids (e.g. acetic acid, propanoic acid or butyric acid), alcohols, aromatic hydrocarbons and aromatic halogenated hydrocarbons, and more particularly such as, but not limited to, chlorobenzene, dichlorobenzene (all isomers thereof), trichlorobenzene, dichlorofluorobenzene (all isomers thereof), chlorodifluorobenzene (all isomers thereof), toluene, xylene and the like, and mixtures thereof in all proportions. The amount of acid that is suitable for performing the process according to the preferred embodiments may depend upon the specific acid used but is usually from about 0.1 to about 3 molar equivalents of the dithiocarbamate moieties present in the polymer to be modified, preferably from 0.5 to 2 equivalents, more preferably from 1 to 1.5 molar equivalents of the dithiocarbamate moieties of the polymer.

The process according to the first aspect can be performed over a broad range of temperatures such as from −30° C. to +130° C., or preferably from 20 to 100° C., for instance from 20 to 70° C. or from 20 to 50° C.

According to a preferred embodiment, the pKa of the acid used for polymer modification is preferably from −10 to +11 and more preferably from −3 to 4. The pKa of the main available organic and inorganic acids (usually measured at room temperature, i.e. about 25° C., in aqueous solutions) is widely available in literature (for instance in Handbook of Chemistry and Physics 81$^{st}$ edition (2000), CRC Press, pages 8-44 to 8-56). In accordance with a preferred embodiment, it is preferred that the pKa (measured at room temperature—about 25° C.—in aqueous solutions) of said acid used for polymer modification is lower than about 4, i.e. with exclusion of the so-called weak acids. Based on the above criteria, acids suitable for the practice of the preferred embodiments mainly include inorganic acids such as but not limited to hydrogen iodide, hydrogen bromide, hydrogen chloride, hydrogen fluoride, sulfuric acid, nitric acid, iodic acid, periodic acid and perchloric acid, as well as $HOClO$, $HOClO_2$ and $HOIO_3$. Some organic acids are also suitable for the practice of the preferred embodiments, including:

phosphonic acids of general formula $RP(O)(OH)_2$.

sulfonic acids including optionally substituted alkylsulfonic acids and arylsulfonic acids such as, but not limited to, methanesulfonic acid, aminobenzenesulfonic acid (all 3 isomers thereof), benzenesulfonic acid, naphthalenesulfonic acid, sulfanilic acid and trifluoromethanesulfonic acid;

monocarboxylic acids including optionally substituted alkylcarboxylic mono-acids and arylalkylcarboxylic mono-acids such as, but not limited to, acetoacetic acid, barbituric acid, bromoacetic acid, bromobenzoic acid (both ortho and meta isomers thereof), chloroacetic acid, chlorobenzoic acid (all 3 isomers thereof), chlorophenoxyacetic acid (all 3 isomers thereof), chloropropionic acid (both $\alpha$ and $\beta$ isomers thereof), cis-cinnamic acid, cyanoacetic acid, cyanobutyric acid, cyanophenoxyacetic acid (all 3 isomers thereof), cyanopropionic acid, dichloroacetic acid, dichloroacetylacetic acid, dihydroxybenzoic acid, dihydroxymalic acid, dihydroxytartaric acid, dinicotinic acid, diphenylacetic acid, fluorobenzoic acid, formic acid, furanecarboxylic acid, furoic acid, glycolic acid, hippuric acid, iodoacetic acid, iodobenzoic acid, lactic acid, lutidinic acid, mandelic acid, $\alpha$-naphthoic acid, nitrobenzoic acid, nitrophenylacetic acid (all 3 isomers thereof), o-phenylbenzoic acid, thioacetic acid, thiophene-carboxylic acid, trichloroacetic acid and trihydroxybenzoic acid; and other acidic substances such as fluoro or nitro-substituted alcohols, e.g. substituted phenols as but not limited to picric acid (2,4,6-trinitrophenol), and ketones such as but not limited to uric acid (trihydroxy-2,6,8-purine or its ketonic form).

Acids suitable for the practice of the preferred embodiments also include, as an alternative embodiment, one of the above acids being generated in situ by methods available in the art. For instance this includes the so-called photo-acid generators, i.e. compounds capable of conversion into acids upon exposure to radiation, e.g. visible light sources or deep ultraviolet (UV) light sources at short wavelengths such as the range from about 100 nm to about 350 nm, or ionizing radiation such as electron-beam or X-rays. Exemplary such photo-acid generators are well known in the field of transferring images to a substrate, especially in the field of photo-resist compositions and patterning processes, and include for instance monomeric generators such as bissulfonyldiazomethanes, bis(cyclohexylsulfonyl)diazomethane, sulfonyldiazo-methanes of U.S. Pat. No. 6,689,530, iodonium salts and sulfonium salts (including the sulfonium salt mixtures of U.S. Pat. No. 6,638,685, especially wherein two groups of a sulfonium cation together form an oxo substituted alkylene group) wherein the anion component is selected from the group consisting of perfluoro-alkylsulfonate, camphorsulfonate, benzensulfonate, alkylbenzensulfonate, fluorine-substituted benzene-sulfonate, fluorine-substituted alkylbenzenesulfonate and halogen (provided that said anion is able to form an acid having a pKa lower than 11, and preferably lower than about 4), and/or wherein the cation component comprises one or more groups such as naphthyl, thienyl or pentafluorophenyl. Such photo-acid generators may also include polymeric generators such as polymers with a molecular weight from about 500 to about 1,000,000 which have a sulfonium salt on their backbone and/or side chains and also have one or more organic photo-acid generating groups on side chains to generate acid by exposure to light; such polymers may be such as in preparative examples 1 and 2 of U.S. Pat. No. 6,660,479 wherein the salt may be p-toluenesulfonic salt, naphtholsulfonic salt or 9,10-dimethoxy-2-anthracenesulfonic salt.

Two or more of the above-mentioned acids may also be suitable for the practice of the preferred embodiments, either in the form of mixtures as far as said acids may be used together under the reaction conditions (i.e. as far as their physical form allows for simultaneous reaction with the polymer to be modified) or by sequential reactions with the polymer in two or more steps.

According to another embodiment, conjugated polymers can be obtained by acid induced elimination of dithiocarbamate moieties that act as leaving groups. Such an embodiment is particularly suitable for the preparation of a polymer or copolymer including repeating units represented by the structural formula (II),

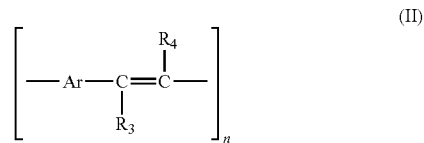

(II)

wherein Ar, $R_3$, $R_4$ and n are as defined herein above. Conjugated polymers obtained according to such an embodiment show a low structural defect level and increased $\lambda_{max}$ values compared to similar conjugated polymers obtained by heat treatment at higher temperatures (usually at least 150° C.) and/or higher conversion times. (usually at least 3 hours).

According to another embodiment, a nucleophile agent can be further added during the process. Such an embodiment is particularly suitable for the preparation of polymer or copolymer including repeating units represented by the structural formula (III),

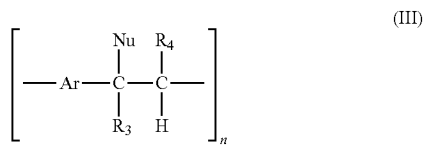

(III)

wherein Ar, $R_3$, $R_4$ and n are as described herein above and wherein Nu is a monovalent group derived from said nucleophile agent through abstraction of a hydrogen atom.

The process according to such an embodiment allows for easy chemical modification, e.g. functionalization, of a precursor polymer obtained via the dithiocarbamate precursor route. Such a modification can be suitably used in order to introduce in an easy and controllable way chemical functions, which can be used for example as (macro)-initiators in further polymerization reactions, In this way grafted-copolymers can be synthesized; which can be used for example in further reaction with bio-molecules towards active layer for biosensors.

A broad range of nucleophile agents can be suitably used in the process according to such an embodiment. Since the nucleophile agent is usually added under acidic conditions, simultaneously with or after addition of at least part of the acid used for modification (elimination of dithiocarbamate moieties), the skilled person readily understands that the selection of an appropriate nucleophile agent needs to take such acidic conditions into account. Preferred nucleophile agents can be for example, but are not limited to, alcohols and/or alcoholates, thiols and/or thiolates, phenols and/or phenolates, thiophenols and/or thiophenolates. Other suitable nucleophile agents include, but are not limited to, dialkylsulfurs, aminoalkanes; anilines, benzylamines, carboxylic aldehydes; carboxylic acid esters; thiocarboxylic acids xanthates; carboxylic acid amides such as maleimides; dialkyl carbonates; nitroalkanes; cyanoalkanes; dialkylsulfoxides; dialkylsulfones; amino-acids; peptides; nucleosides; heterocyclic bases such as imidazoles, quinolines, isoquinolines, pyridines, pyrazines and quinoxalines; alkaloids and modified DNA, phosphines.

Carboxylic acids may also constitute suitable nucleophile agents. Some of them, especially when exhibiting a $pK_a$ at room temperature below 11, or even below 4, are peculiar in the sense that they also meet the criteria for performing the acid-induced elimination of dithiocarbamate moieties in a previous step of the method.

In a specific embodiment the nucleophilic agent can be selected from the group consisting of compounds represented by one the structural formulae $R_5OH$, $R_5SH$, $R_6NH_2$, $RN_3$, $RSR_5$, RCOOH, RCOSH, $ROSSR_5$, $RCONR_5$, wherein each of R, $R_5$ and $R_6$ is independently selected from the group consisting of $C_{1-20}$ alkyl, $C_{2-20}$ alkenyl, aryl and aryl-$C_{1-4}$ alkyl.

The amount of nucleophile reagent suitable for addition in the process according to this embodiment may be from 0.1 to 10 molar equivalent of the dithiocarbamate moieties present in the starting polymer with the structural formula (I). Preferably this amount is from 0.5 to 5 molar equivalents and, more preferably from 1 to 2 equivalents of the dithiocarbamate moieties of said polymer. Modified polymers and copolymers obtained in such a way can contain chromophores, bioactive molecules or functionalities that can take part in a further chemical reaction or a further polymerization process as a monomer or as an initiating site.

In yet another embodiment the process according to the preferred embodiments can be applied in a two-step modification method of the polymer (I), resulting in both a partial dithiocarbamate conversion and a partial functionalization. In first instance, according to this particular embodiment, a number of substituents Nu are introduced into the polymer structure by using a limited amount of a strong acid, more specifically a non-nucleophilic acid, in the presence of nucleophile agent, e.g. a neutral nucleophile agent. Afterwards, the partly substituted precursor polymer can be further partially or completely converted (with elimination of residual dithiocarbamate moieties) in the presence of an additional adequate amount of acid.

Furthermore, the ratio between substitution and elimination reactions during performance of the method of the preferred embodiments can be controlled by monitoring the temperature (higher temperatures are known from the skilled person to favor the elimination reaction) and/or by adding a strong nucleophile agent (this being known from the skilled person to favor the substitution reaction).

According to a second aspect, polymers and copolymers are provided represented by the structural formula (IV),

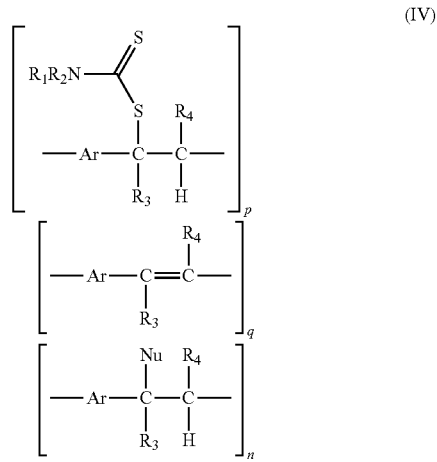

wherein:
Ar is arylene or heteroarylene optionally substituted with one or more substituents independently selected from the group consisting of $C_{1-20}$ alkyl, $C_{1-20}$ alkoxy, $C_{1-20}$ alkylsulfate, aryl and aryl-$C_{1-4}$ alkyl groups, $R_1$ and $R_2$ are independently selected from the group consisting of $C_{1-20}$ alkyl, $C_{3-20}$ cycloalkyl, aryl, aryl-$C_{1-4}$ alkyl and heterocyclyl, $R_3$ and $R_4$ are independently selected from the group consisting of hydrogen, $C_{1-20}$ alkyl, $C_{3-20}$ cycloalkyl, aryl, aryl-$C_{1-4}$ alkyl and heterocyclyl, n, p, q are integers such as the number average molecular weight of the polymer or copolymer is from 5,000 to 1,000,000 Dalton, p and q can be equal to 0, and n is at least 1, Nu is selected from the group consisting of $OR_5$, $SR_5$, $NHR_5$, $OC(O)R_5$, $SC(O)R_5$, wherein $R_5$ is selected from the group consisting of $C_{1-20}$ alkyl, $C_{2-20}$ alkenyl and aryl.

According to a specific embodiment of the second aspect, the molecular weight polydispersity of the polymer or copolymer represented by the structural formula (IV) ranges from 1.05 to 20, preferably from 1.2 to 10, more preferably from 1.2 to about 5.0.

According to a third aspect, a device is provided comprising one or more layers, preferably at least one thin layer, of a polymer or copolymer represented by the structural formula (IV) according to the second aspect, or a polymer modified according to the method of the first aspect. According to a specific embodiment, this aspect is particularly suitable for devices such as, but not limited to, a solar cell, a light-emitting diode, a chemical sensor, a biological sensor or an integrated circuit component.

The present invention will be further described with reference to certain more specific embodiments and examples, but the present invention is not limited thereto but only by the attached claims. The following examples are given by way of illustration only, and repeatedly include the following methodologies.

Obtaining a Conjugated Polymer by Conversion in Solution with an Acid

A precursor polymer having dithiocarbamate moieties was synthesized via the so-called dithiocarbamate precursor route and then dissolved in a solvent until a given concentration and then degassed by passing through a continuous nitrogen flow. The relevant acid was added to the mixture and the temperature was optionally increased from 20° C. up to 70° C. during the conversion procedure.

Post-Functionalization of a Polymer After Conversion in Solution with an Acid

The at least partly converted precursor polymer was dissolved in a solvent until a given concentration and then degassed by passing through a continuous nitrogen flow. An adequate nucleophile agent was added (from equimolar amount to large excess) to the reaction mixture. An acid was then added and the temperature optionally increased from 20° C. up to 70° C. during the further conversion procedure.

Example 1

Conversion of a dithiocarbamate-containing poly(2,5-thienylene vinylene) precursor polymer with benzenesulfonic acid at 70° C.

To a solution of 70 mg of a precursor polymer with dithiocarbamate moieties (represented by the structural formula (I) wherein Ar=2,5-thienylene-3-hexyl, $R_1=R_2=C_2H_5$, $R_3=R_4=H$, Mw=57,000; Mn=22,000; PDI (polydispersity index)=2.5 dissolved in chlorobenzene (5 ml), benzenesulfonic acid (1.5 molar equivalents based on the amount of dithiocarbamate moieties in the precursor polymer) was added as a solid. The solution was heated at 70° C. under $N_2$. The color of the solution (precursor polymer+chlorobenzene) turned from pale orange to a darker color immediately after addition of the acid. After 10 minutes the color of the reaction mixture became deep blue, thus indicating a high conversion ratio. Samples were taken from the reaction mixture at different points in time (after 10 minutes; 1 hour and 5 hours, respectively) and worked up as follows. The excess of acid was neutralized and then an extraction with chloroform was carried out. After evaporation of the solvent, UV-Visible spectra (in film) were taken at room temperature for each sample and compared with the UV-Visible spectrum of a thermally converted comparative polymer (obtained by conversion in dichlorobenzene under reflux at 175° C. after 12 hours).

The conjugated polymer converted with the use of benzenesulfonic acid shows $\lambda_{max}$ values (586 nm after 1 hour, 610 nm after 5 hours) significantly higher than the comparative polymer converted under reflux at 175° C. in dichlorobenzene after 12 hours ($\lambda_{max}$ 572 nm). The spectral data of the produced polymer is consistent with the structural formula (II) wherein Ar=2,5-thienylene-3-hexyl, and $R_3=R_4=H$.

Example 2

Conversion of a dithiocarbamate-containing poly(2,5-thienylene vinylene) precursor polymer with benzenesulfonic acid without heating A solution of a precursor polymer (as used in example 1) in chlorobenzene and 1.5 equivalents of benzenesulfonic acid (molar equivalents of the amount of dithiocarbamate moiety in the polymer) into a quartz cell was monitored by means of a UV-Visible technique. The spectra were taken every two minutes in the first five hours and every 20 minutes afterwards. The conversion was followed for 24 hours. The reaction mixture started to change color immediately after the addition of the acid. It could be noticed that the $\lambda_{max}$ value of the product obtained was 529 nm, meaning that the polymer was almost totally converted to its conjugated form. A further heat treatment at 175° C. lead to a polymer with the $\lambda_{max}$ value of 530 nm, i.e. no increase of the $\lambda_{max}$ value was observed. This example shows that a competition between conversion process and nucleophile substitution occurred using this experimental conditions. No conversion of the precursor polymer is taking place in a similar condition, e.g. at room temperature, without addition of the acid; the polymer in the absence of acid showed a broad peak as $\lambda_{max}$ value of from 200 to 300 nm corresponding to the precursor polymer.

Example 3

Conversion of a dithiocarbamate-containing poly(2,5-thienylene vinylene) precursor polymer with benzenesulfonic acid In order to control the rate of conversion, 0.3 eq. of benzenesulfonic acid (molar equivalents of the amount of dithiocarbamate moiety in the polymer) were added to a solution of precursor polymer (as in example 1) in chlorobenzene. The reaction was followed in solution at room temperature by means of UV-Visible spectra taken every two minutes in the first five hours and every 20 minutes afterwards. The conversion was followed for 24 hours. The color of the reaction mixture after 24 hours appeared to be dark orange. Only a partial conversion was induced as it appears from the UV-Visible spectrum (very broad flat peak from 379 nm to 522 nm). The so prepared solution was kept and analyzed again after four days by UV-Visible, and it showed the presence of an improvement of the conversion of the precursor polymer into its conjugated form (as evidenced by a broad peak with two maximum values $\lambda_{max}$ at 426 and 524 nm). A further heat treatment at 175° C. during 12 hours gave a polymer with a $\lambda_{max}$ value of 570 nm. Accordingly this example shows that the speed and rate of the conversion reaction can be controlled by the amount of acid used and the reaction time. The substitution process can be limited by the amount of acid used, as compared with the further heat treatment of example 2.

Example 4

Conversion of a dithiocarbamate-containing poly(2,5-thienylene vinylene) precursor polymer with trifluoroacetic acid To a solution of the precursor polymer of example 1 in chlorobenzene, trifluoroacetic acid (1.5 molar equivalent based on the amount of dithiocarbamate moieties in the precursor polymer) was added. The reaction was monitored at room temperature in solution by UV-Visible spectrum. Fast conversion was obtained, with a $\lambda_{max}$ value of 566 nm after 220 minutes. No sign of degradation was observed since a plateau in the absorption/time curve was observed Example 5

Conversion of a poly(2,5-thienylene vinylene) precursor polymer with trifluoroacetic acid and addition of a thiol A few drops of octanethiol were added to a mixture of the precursor polymer of example 1 and trifluoroacetic acid (1.5 molar equivalents) in chlorobenzene. The reaction was followed by the evolution of the UV-Visible spectrum along time. In order to check that nucleophilic substitution by the thiol onto the precursor polymer backbone occurred, an oxidation of the resulting polymer was performed using $H_2O_2$/

TeO$_2$ in dioxane. Comparison of the FT-I.R. spectra before and after oxidation clearly showed appearance of an absorption band characteristic of the presence of a sulfoxide group, thus confirming the presence of an octylthio group onto the polymer before oxidation.

Example 6 (COMPARATIVE)

Conversion of a xanthate-containing poly(2,5-thienylene vinylene) precursor polymer with benzenesulfonic acid A solution of xanthate precursor polymer having the following structure:

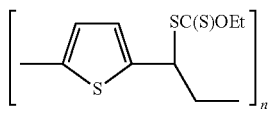

was dissolved in chlorobenzene into a quartz cell, 1.5 molar equivalents (based on the xanthate moieties) of benzenesulfonic acid was added and the reaction was monitored by UV-Visible spectrum. Spectra were taken every two minutes in the first five hours and every 20 minutes afterwards until 24 hours. No sign of polymer conversion was observed, thus showing the specific nature of acid conversion with dithiocarbamate groups

Example 7

Conversion of a dithiocarbamate-containing poly(1,4-phenylene vinylene) precursor polymer with benzenesulfonic acid The experimental procedure of example 1 is repeated, except for using a precursor polymer with dithiocarbamate moieties represented by the structural formula (I) wherein Ar=2-methoxy-5-(3',7'-dimethyloctyloxy)-1,4, $R_1$=$R_2$=$C_2H_5$, and $R_3$=$R_4$=H. The same observations are made, showing rapid conversion within 30 minutes into a poly(1,4-phenylene vinylene) derivative.

Example 8

Conversion of a poly(2,5-thienylene vinylene) precursor polymer with trifluoroacetic acid and addition of methanol The experimental procedure of example 5 is repeated, except for using methanol instead of octanethiol. Similar observations are made, including the indirect control of a methoxy group present onto the resulting polymer.

Example 9

Conversion of a poly(2,5-thienylene vinylene) precursor polymer with trifluoroacetic acid and addition of phenol The experimental procedure of example 5 is repeated, except for using phenol instead of octanethiol. Similar observations are made, including the indirect control of a phenoxy group present onto the resulting polymer.

Example 10

Conversion of a poly(2,5-thienylene vinylene) precursor polymer with trifluoroacetic acid and addition of benzyl alcohol The experimental procedure of example 5 is repeated, except for using benzyl alcohol instead of octanethiol. Similar observations are made, including the indirect control of a benzyloxy group present onto the resulting polymer.

Example 11

Conversion of a poly(2,5-thienylene vinylene) precursor polymer with trifluoroacetic acid and addition of 3-buten-2-ol The experimental procedure of example 5 is repeated, except for using methanol instead of octanethiol. Similar observations are made, including the indirect control of a 3-buten-2-oxy group present onto the resulting polymer.

Example 12

Conversion of a poly(2,5-thienylene vinylene) precursor polymer with trifluoroacetic acid and addition of thiophenol The experimental procedure of example 5 is repeated, except for using thiophenol instead of octanethiol. Similar observations are made, including the indirect control of a phenylthio group present onto the resulting polymer.

Example 13

Conversion of a poly(2,5-thienylene vinylene) precursor polymer with trifluoroacetic acid and addition of allylmercaptan The experimental procedure of example 5 is repeated, except for using methanol instead of octanethiol. Similar observations are made, including the indirect control of a 2-propene-1-thio group present onto the resulting polymer.

Example 14

Conversion of a poly(2,5-thienylene vinylene) precursor polymer with trifluoroacetic acid and addition of methylamine The experimental procedure of example 5 is repeated, except for using methylamine instead of octanethiol. Similar observations are made, including the indirect control of a methylamino group present onto the resulting polymer.

Example 15

Conversion of a poly(2,5-thienylene vinylene) precursor polymer with trifluoroacetic acid and addition of allylamine The experimental procedure of example 5 is repeated, except for using allylamine instead of octanethiol. Similar observations are made, including the indirect control of a propene-2-amino group present onto the resulting polymer.

Example 16

Conversion of a poly(2,5-thienylene vinylene) precursor polymer with trifluoroacetic acid and addition of aniline The experimental procedure of example 5 is repeated, except for using aniline instead of octanethiol. Similar observations are made, including the indirect control of an anilino group present onto the resulting polymer.

Example 17

Conversion of a poly(2,5-thienylene vinylene) precursor polymer with trifluoroacetic acid and addition of benzylamine The experimental procedure of example 5 is repeated, except for using benzylamine instead of octanethiol. Similar observations are made, including the indirect control of a benzylamino group present onto the resulting polymer.

Example 18

Conversion of a poly(2,5-thienylene vinylene) precursor polymer with trifluoroacetic acid and addition of thiolacetic acid The experimental procedure of example 5 is repeated, except for using thiolacetic acid instead of octanethiol. Similar observations are made, including the indirect control of an acetylthio group present onto the resulting polymer.

Example 19

Conversion of a poly(2,5-thienylene vinylene) precursor polymer with trifluoroacetic acid and addition of acetic acid The experimental procedure of example 5 is repeated, except for using acetic acid instead of octanethiol. Similar observations are made, including the indirect control of an acetoxy group present onto the resulting polymer.

Example 20

Conversion of a poly(2,5-thienylene vinylene) precursor polymer with trifluoroacetic acid and addition of benzoic acid The experimental procedure of example 5 is repeated, except for using benzoic acid instead of octanethiol. Similar observations are made, including the indirect control of a benzoxy group present onto the resulting polymer.

Example 21

Modification of a poly(2,5-thienylene vinylene) precursor polymer with benzenesulfonic acid followed by the addition of a biotin derivative such as Biotin-PEO2-PPO2-amine or biotin ethylene-diamine 5 molar equivalents of a biotin based derivative represented by the structural formula below

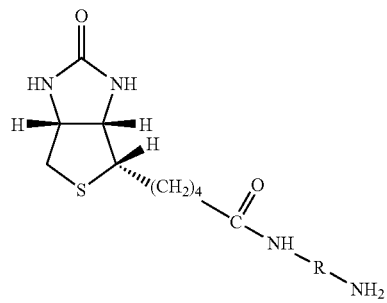

wherein R is for example, but not limited to, $CH_2$—$CH_2$ or $CH_2$—$CH_2$—$(CH_2$—$O)_3$—$CH_2$—$CH_2$, is added to a mixture of the precursor polymer of example 1 and benzenesulfonic acid (1.5 molar equivalent, based on dithiocarbamate moieties) in chlorobenzene. Substitution of the dithiocarbamate groups by the biotin moiety via the terminal —$NH_2$ function onto the precursor polymer backbone occurs, as evidenced by FTIR and NMR.

Example 22

Modification of a poly (p-phenylene vinylene) precursor polymer with benzenesulfonic acid followed by the addition of a biotin derivative such as Biotin-PEO2-PPO2-amine or biotin ethylene-diamine 5 molar equivalents of a biotin based derivative represented by the structural formula below

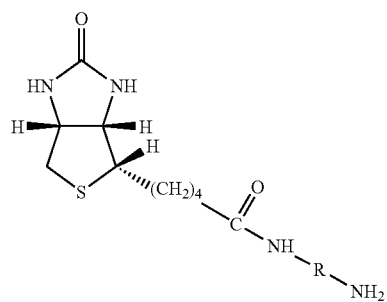

wherein R is for example, but not limited to, $CH_2$—$CH_2$ or $CH_2$—$CH_2$—$(CH_2$—$O)_3$—$CH_2$—$CH_2$, is added to a mixture of the precursor polymer of example 1 and benzenesulfonic acid (1.5 molar equivalent, based on dithiocarbamate moieties) in chlorobenzene. Substitution of the dithiocarbamate groups by the biotin moiety via the terminal —$NH_2$ function onto the precursor polymer backbone occurs, as evidenced by FTIR and NMR.

Example 23

Modification of a poly(2,5-thienylene vinylene) precursor polymer with benzenesulfonic acid followed by the addition of a maleimide derivative such as 6-maleimidocaproic acid or 4-maleimidobutanoic acid 5 molar equivalents of a maleimide based derivative represented by the structural formula

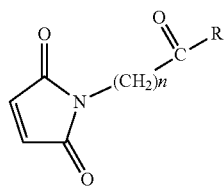

wherein n is an integer e.g. from 3 to 5, and R is for instance OH are added to a mixture of the precursor polymer of example 1 and benzenesulfonic acid (1.5 molar equivalent, based on dithiocarbamate moieties) in chlorobenzene. Substitution of the dithiocarbamate moieties by the maleimide based derivative via the terminal carboxylic acid group onto the precursor polymer backbone occurs, as evidenced by FTIR and NMR.

Example 24

Modification of a poly(p-phenylene vinylene) precursor polymer with benzenesulfonic acid followed by the addition of a maleimide derivative such as 6-maleimidocaproic acid or 4-maleimidobutanoic acid 5 molar equivalents of a maleimide based derivative represented by the structural formula

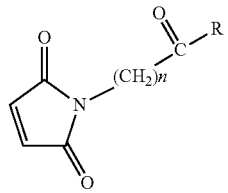

wherein n is an integer e.g. from 3 to 5, and R is for instance OH are added to a mixture of the precursor polymer of example 1 and benzenesulfonic acid (1.5 molar equivalent, based on dithiocarbamate moieties) in chlorobenzene. Substitution of the dithiocarbamate moieties by the maleimide based derivative via the terminal carboxylic acid group onto the precursor polymer backbone occurs, as evidenced by FTIR and NMR.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for modifying a polymer having dithiocarbamate moieties, the method comprising a step of reacting a polymer with an acid whereby a modified polymer is obtained, wherein the polymer prior to modification is represented by the structural formula (I)

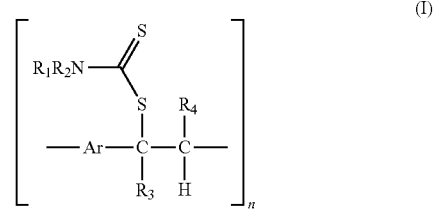

wherein:
Ar is arylene or heteroarylene, wherein Ar is unsubstituted or substituted with one or more substituents independently selected from the group consisting of $C_{1-20}$ alkyl, $C_{1-20}$ alkoxy, $C_{1-20}$ alkylsulfate, aryl and aryl-$C_{1-4}$ alkyl;
$R_1$ and $R_2$ are independently selected from the group consisting of $C_{1-20}$ alkyl, $C_{3-10}$ cycloalkyl, aryl, aryl-$C_{1-20}$ alkyl and heterocyclyl;
$R_3$ and $R_4$ are independently selected from the group consisting hydrogen, $C_{1-20}$ alkyl, $C_{3-10}$ cycloalkyl, aryl, aryl-$C_{1-4}$ alkyl and heterocyclyl; and
n is such that a number average molecular weight of the polymer is from 5000 to 1000000 Dalton.

2. The method according to claim 1, wherein the modifying is a functionalization of the polymer.

3. The method according to claim 2, wherein the modifying is forming a conjugated polymer or substituting at least a part of the dithiocarbamate moieties to thereby introduce another functionality.

4. The method according to claim 2, wherein the modifying comprises protonation of at least a part of the dithiocarbamate moieties.

5. The method according to claim 1, wherein the acid is used in an amount of from 0.1 to 3 molar equivalents of the dithiocarbamate moieties present in the polymer.

6. The method according to claim 1, wherein reacting said polymer with said acid is performed at a temperature of from −30° C. to +130° C.

7. The method according to claim 1, wherein reacting said polymer with said acid is performed at a temperature of from 20° C. to 100° C.

8. The method of claim 1, wherein the modified polymer is represented by the structural formula (II)

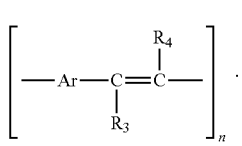

(II)

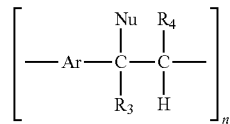

(III)

9. The method according to claim 1, wherein Ar is selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,5-furanediyl; 2,5-pyrrolediyl; 1,3,4-oxadiazole-2,5-dyil; 1,3,4-thiadiazole-2,5-diyl; 2,3-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; and dibenzothiophene-2,7-diyl.

10. The method according to claim 1, further comprising a step of reacting the modified polymer with a nucleophile agent, whereby a post-functionalized polymer is obtained.

11. The method according to claim 10, wherein the nucleophile agent is selected from the group consisting of alcohols, thiols, phenols, thiophenols, dialkylsulfurs, aminoalkanes, anilines, carboxylic acids, carboxylic aldehydes, carboxylic acid esters, thiocarboxylic acids and esters thereof, xanthates, carboxylic acid amides, amino-acids, peptides, nucleosides, heterocyclic bases, alkaloids and modified DNA.

12. The method according to claim 10, wherein the post-functionalized polymer is a polymer or copolymer comprising repeating units represented by the structural formula (III), wherein Nu is a monovalent group derived from the nucleophile agent.

13. The method according to claim 12, wherein Nu is selected from the group consisting of $OR_5$, $SR_5$, $NHR_6$, $OC(O)R_5$, $SC(O)R_5$, and wherein each of $R_5$ and $R_6$ is independently selected from the group consisting of $C_{1-20}$ alkyl, $C_{2-20}$ alkenyl, and aryl.

14. The method according to claim 10, wherein the nucleophile agent is reacted in an amount of from 0.1 to 10 molar equivalents of the dithiocarbamate moieties present in the polymer represented by the structural formula (I).

15. The method according to claim 1, wherein the acid exhibits a pKa from −10 to +11.

16. The method according to claim 1, wherein the acid exhibits a pKa from −3 to +4.

17. The method according to claim 1, wherein the acid exhibits a pKa of about +4.

18. The method according to claim 1, wherein the acid is an organic acid selected from the group consisting of carboxylic acids, phosphonic acids, sulfonic acids, and mixtures thereof.

19. The method according to claim 1, wherein the acid is an inorganic acid.

* * * * *

UNITED STATES PATENT AND TRADEMARK OFFICE
CERTIFICATE OF CORRECTION

PATENT NO.       : 8,173,267 B2
APPLICATION NO.  : 12/026385
DATED            : May 8, 2012
INVENTOR(S)      : Lutsen et al.

It is certified that error appears in the above-identified patent and that said Letters Patent is hereby corrected as shown below:

| | Issued Patent | | Description of Discrepancy |
|---|---|---|---|
| | Column | Line | |
| | In the Specification: | | |
| | 3 | 43 | Change "thiamorpholinyl," to -- thiomorpholinyl,--. |
| | 3 | 52-53 | Change "quinoleinyl, oxyquinoleinyl," to --quinolinyl, oxyquinolinyl,--. |
| | 4 | 19 | Change "phtalazinyl), phtalidyl, phtalimidinyl, phtalazonyl," to --phthalazinyl), phthalidyl, phthalimidinyl, phthalazonyl,--. |
| | 5 | 5 | Change "alkysulfate"" to --alkylsulfate"--. |
| | 5 | 30 | Change "(nucleophillic" to --(nucleophilic--. |
| | 6 | 15 | Change "dyil;" to --diyl;--. |
| | 6 | 18 | Change "phenantrene" to --phenanthrene--. |
| | 6 | 19 | Change "dihydrophenantrene" to --dihydrophenanthrene--. |
| | 7 | 13 | Change "HOIO$_3$." to --HOClO$_3$.--. |
| | 7 | 35 | Change "furanecarboxylic" to --furancarboxylic--. |
| | 7 | 67 | Change "benzensulfonate, alkylbenzensulfonate," to --benzenesulfonate, alkylbenzenesulfonate,--. |
| | 8 | 67 | Change "reactions," to --reactions.--. |
| | 9 | 1 | Change "synthesized;" to --synthesized,--. |
| | 9 | 17 | Change "acids" to --acid--. |
| | 12 | 53 | Change "observed" to --observed.--. |

Signed and Sealed this
Eighteenth Day of September, 2012

David J. Kappos
*Director of the United States Patent and Trademark Office*

CERTIFICATE OF CORRECTION (continued)
U.S. Pat. No. 8,173,267 B2

| | | |
|---|---|---|
| 13 | 30 | Change "groups" to --groups.--. |
| | In the Claims | |
| 18 | 22 | In Claim 1, change "(I)" to --(I),--. |
| 18 | 67 | In Claim 8, change "(II)" to --(II),--. |
| 19 | 12 | In Claim 9, change "9, 10" to --9,10--. |
| 19 | 13 | In Claim 9, change "dyil;" to --diyl;--. |
| 19 | 16 | In Claim 9, change "4,5,9, 10" to --4,5,9,10--. |
| 19 | 17 | In Claim 9, change "phenantrene" to --phenanthrene--. |
| 19 | 17 | In Claim 9, change "dihydrophenantrene" to --dihydrophenanthrene--. |
| 20 | 12 | In Claim 13, change "$SR_S$," to --$SR_5$,--. |